United States Patent
Tsai et al.

(10) Patent No.: US 10,509,482 B1
(45) Date of Patent: Dec. 17, 2019

(54) KEYBOARD DEVICE

(71) Applicant: Primax Electronics Ltd., Taipei (TW)

(72) Inventors: Lei-Lung Tsai, Taipei (TW); Yi-Shu Lee, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 16/192,189

(22) Filed: Nov. 15, 2018

(30) Foreign Application Priority Data

Aug. 17, 2018 (TW) .............................. 107128838 A (51) Int. Cl.
*H01H 13/7065* (2006.01)
*G06F 3/02* (2006.01)
*H03K 17/967* (2006.01)

(52) U.S. Cl.
CPC ....... *G06F 3/0202* (2013.01); *H01H 13/7065* (2013.01); *H03K 17/967* (2013.01); *H01H 2221/044* (2013.01)

(58) Field of Classification Search
CPC ...... H01H 3/125; H01H 13/705; H01H 13/83; H01H 2227/036; H01H 3/122; H01H 13/7065; H01H 13/84; H01H 13/85; H01H 2215/006

See application file for complete search history.

(56) References Cited

U.S. PATENT DOCUMENTS

| | | | | |
|---|---|---|---|---|
| 5,278,371 A | * | 1/1994 | Watanabe | H01H 3/125 200/344 |
| 6,730,868 B1 | * | 5/2004 | Watanabe | H01H 3/125 200/344 |
| 7,173,200 B2 | * | 2/2007 | Yoneyama | H01H 3/125 200/344 |
| 7,319,202 B2 | * | 1/2008 | Sato | H01H 3/125 200/344 |
| 7,449,651 B2 | * | 11/2008 | Lin | H01H 3/125 200/344 |
| 8,164,017 B2 | * | 4/2012 | Cheng | H01H 3/125 200/344 |
| 2012/0193202 A1 | * | 8/2012 | Chen | H01H 3/125 200/344 |
| 2016/0064165 A1 | * | 3/2016 | Chao | H01H 13/14 200/344 |
| 2018/0025862 A1 | * | 1/2018 | Chen | G06F 1/16 200/5 A |

* cited by examiner

*Primary Examiner* — Ahmed M Saeed (74) *Attorney, Agent, or Firm* — Kirton McConkie; Evan R. Witt (57) ABSTRACT

A keyboard device includes a base plate with a base plate with a connecting bracket, a wing-type connecting element and a keycap. A first connecting shaft of the wing-type connecting element is inserted into the connecting bracket, so that the wing-type connecting element is connected with the base plate. While the keycap is depressed, the first connecting shaft is inserted into a first receiving space of the connecting shaft and used as a swinging fulcrum. Since the vertical movement of the wing-type connecting element is restricted by the first receiving space, the swinging range of the wing-type connecting element is reduced. Consequently, the keyboard device of the present invention is capable of improving the depressing stability of the keycap.

10 Claims, 6 Drawing Sheets

KEYBOARD DEVICE

FIELD OF THE INVENTION

The present invention relates to an input device, and more particularly to a keyboard device with plural key structures.

BACKGROUND OF THE INVENTION

Generally, the widely-used peripheral input device of a computer system includes for example a mouse device, a keyboard device, a trackball device, or the like. Via the keyboard device, characters or symbols can be directly inputted into the computer system. Consequently, most users and most manufacturers of input devices pay much attention to the development of keyboard devices. For example, a keyboard device with plural key structures is one of the common keyboard devices.

Figure 1:
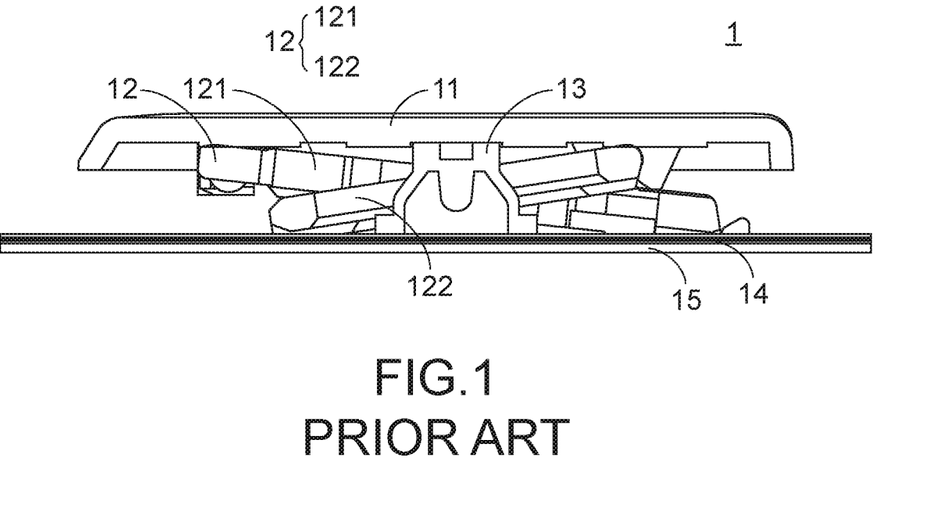
FIG. 1 is a schematic cross-sectional side view illustrating a conventional key structure.

A key structure of a keyboard device will be described as follows. The key structure comprises a scissors-type connecting element. FIG. 1 is a schematic cross-sectional side view illustrating a conventional key structure. As shown in FIG. 1, the conventional key structure 1 comprises a keycap 11, a scissors-type connecting element 12, a rubbery elastomer 13, a membrane switch circuit member 14 and a base plate 15. The keycap 11, the scissors-type connecting element 12, the rubbery elastomer 13 and the membrane switch circuit member 14 are supported by the base plate 15. The scissors-type connecting element 12 is used for connecting the base plate 15 and the keycap 11.

The scissors-type connecting element 12 is arranged between the base plate 15 and the keycap 11, and the base plate 15 and the keycap 11 are connected with each other through the scissors-type connecting element 12. The scissors-type connecting element 12 comprises a first frame 121 and a second frame 122. A first end of the first frame 121 is connected with the keycap 11. A second end of the first frame 121 is connected with the base plate 15. The rubbery elastomer 13 is enclosed by the scissors-type connecting element 12. The membrane switch circuit member 14 comprises plural key intersections (not shown). When one of the plural key intersections is triggered, a corresponding key signal is generated. The rubbery elastomer 13 is disposed on the membrane switch circuit member 14. Each rubbery elastomer 13 is aligned with a corresponding key intersection. When the rubbery elastomer 13 is depressed, the rubbery elastomer 13 is subjected to deformation to push the corresponding key intersection of the membrane switch circuit member 14. Consequently, the corresponding key signal is generated.

The operations of the conventional key structure 1 in response to the depressing action of the user will be illustrated as follows. Please refer to FIG. 1 again. When the keycap 11 is depressed, the keycap 11 is moved downwardly to push the scissors-type connecting element 12 in response to the depressing force. As the keycap 11 is moved downwardly relative to the base plate 15, the keycap 11 pushes the corresponding rubbery elastomer 13. At the same time, the rubbery elastomer 13 is subjected to deformation to push the membrane switch circuit member 14 and trigger the corresponding key intersection of the membrane switch circuit member 14. Consequently, the membrane switch circuit member 14 generates a corresponding key signal. When the keycap 11 is no longer depressed by the user, no external force is applied to the keycap 11 and the rubbery elastomer 13 is no longer pushed by the keycap 11. In response to the elasticity of the rubbery elastomer 13, the rubbery elastomer 13 is restored to its original shape to provide an upward elastic restoring force. Consequently, the keycap 11 is returned to its original position where it is not depressed. The structures and the operations of the conventional key structure have been mentioned as above.

However, while the keycap 11 is depressed, the first frame 121 and the second frame 122 are swung with the movement of the keycap 11. As the first frame 121 and the second frame 122 are swung, the first frame 121 and the second frame 122 are rocked. Since the keycap 11 is correspondingly rocked, the movement of the keycap is unstable.

Therefore, there is a need of providing a keyboard device with enhanced depressing stability

SUMMARY OF THE INVENTION

An object of the present invention provides a keyboard device with enhanced depressing stability.

In accordance with an aspect of the present invention, there is provided a keyboard device. The keyboard device includes a base plate, a wing-type connecting element and a keycap. The base plate includes at least one connecting bracket. The wing-type connecting element is disposed on the base plate, and connected with the at least one connecting bracket. The wing-type connecting element is permitted to be swung relative to the base plate. The wing-type connecting element includes a first frame and a second frame. The first frame is located under the keycap and arranged near a first side of the keycap. The first frame comprises a first sliding shaft. The first sliding shaft and a first end of the first frame are inserted into the at least one connecting bracket. Consequently, the first frame and the base plate are combined together. The second frame is located under the keycap and arranged near a second side of the keycap. The second frame includes a second sliding shaft. A first end of the second frame is inserted into the first frame. Consequently, the second frame and the first frame are combined together. The second frame is connected with the base plate through the first end of the first frame and the second sliding shaft. The keycap is connected with a second end of the first frame and a second end of the second frame, and movable relative to the base plate. While the keycap is depressed, the first end of the first frame is moved within a first receiving space of the at least one connecting bracket in a vertical direction.

In an embodiment, the first frame further includes a first connecting shaft, a second connecting shaft and an indentation. The first connecting shaft is located at the first end of the first frame and disposed on an outer side of the first frame. The first connecting shaft is inserted into the first receiving space of the at least one connecting bracket. The second connecting shaft is located at the second end of the first frame, and connected with the keycap. The indentation is located at the first end of the first frame and formed in an inner side of the first frame. A first end of the second frame is inserted into the indentation. Consequently, the first frame and the second frame are combined together. The at least one connecting bracket further includes a second receiving space, and the second receiving space is arranged beside the first receiving space. The first sliding shaft is arranged between the first connecting shaft and the second connecting shaft, arranged near the first connecting shaft, and inserted into the second receiving space.

In an embodiment, the second frame further includes a third connecting shaft and a fourth connecting shaft. The third connecting shaft is located at the first end of the second frame. The third connecting shaft is inserted into the indentation of the first frame. Consequently, the first frame and the second frame are combined together. The fourth connecting shaft is located at the second end of the second frame. The fourth connecting shaft is connected with the keycap. The at least one connecting bracket further includes a third receiving space, and the third receiving space is arranged beside the first receiving space. The second sliding shaft is arranged between the third connecting shaft and the fourth connecting shaft, arranged near the third connecting shaft, and inserted into the third receiving space.

From the above descriptions, the present invention provides the keyboard device. The wing-type connecting element is connected with the base plate and the keycap. The connecting bracket has a special shape. The base plate and the wing-type connecting element are combined together through the connecting bracket. Due to the structures of the wing-type connecting element and the connecting bracket, the swinging extent of the wing-type connecting element is smaller than the swinging extent of the conventional scissors-type connecting element. Since the swinging extent of the wing-type connecting element is reduced when compared with the conventional scissors-type connecting element, the wing-type connecting element is swung more stably. Consequently, the depressing stability of the keycap is enhanced. In addition, the thickness of the keyboard device is reduced. While the keycap is depressed, the first connecting shaft of the wing-type connecting element is inserted into the connecting bracket to be used as the swinging fulcrum. Consequently, the vertical movement of the connecting bracket is restricted by the height of the first receiving space. Consequently, the movable range of the first connecting shaft in the vertical direction is controllable. That is, the travelling distance of the keycap of the keyboard device can be controlled.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

For solving the drawbacks of the conventional technologies, the present invention provides a keyboard device.

Figure 2:
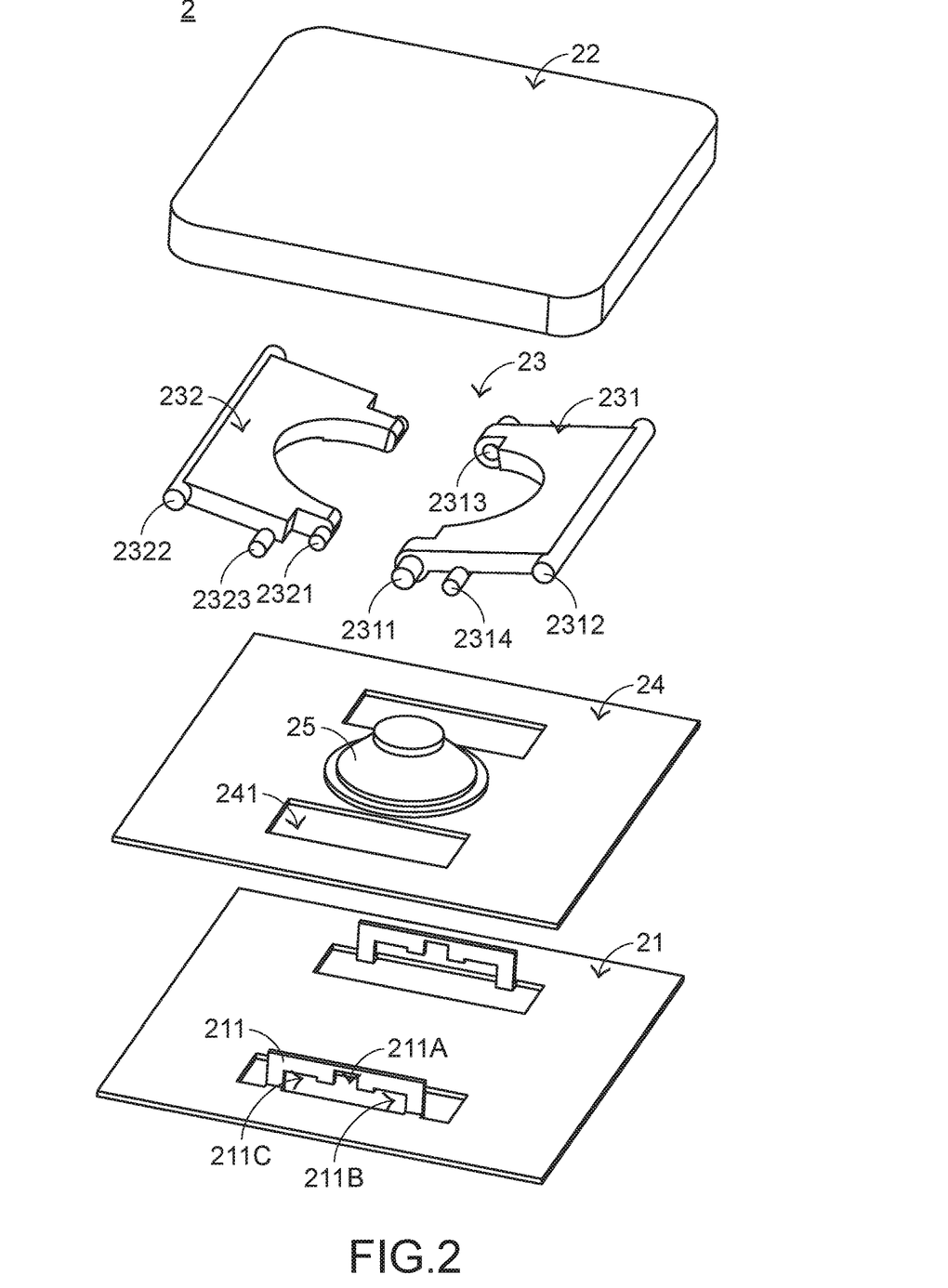
FIG. 2 is a schematic exploded view illustrating a portion of a keyboard device according to an embodiment of the present invention.
Figure 3:
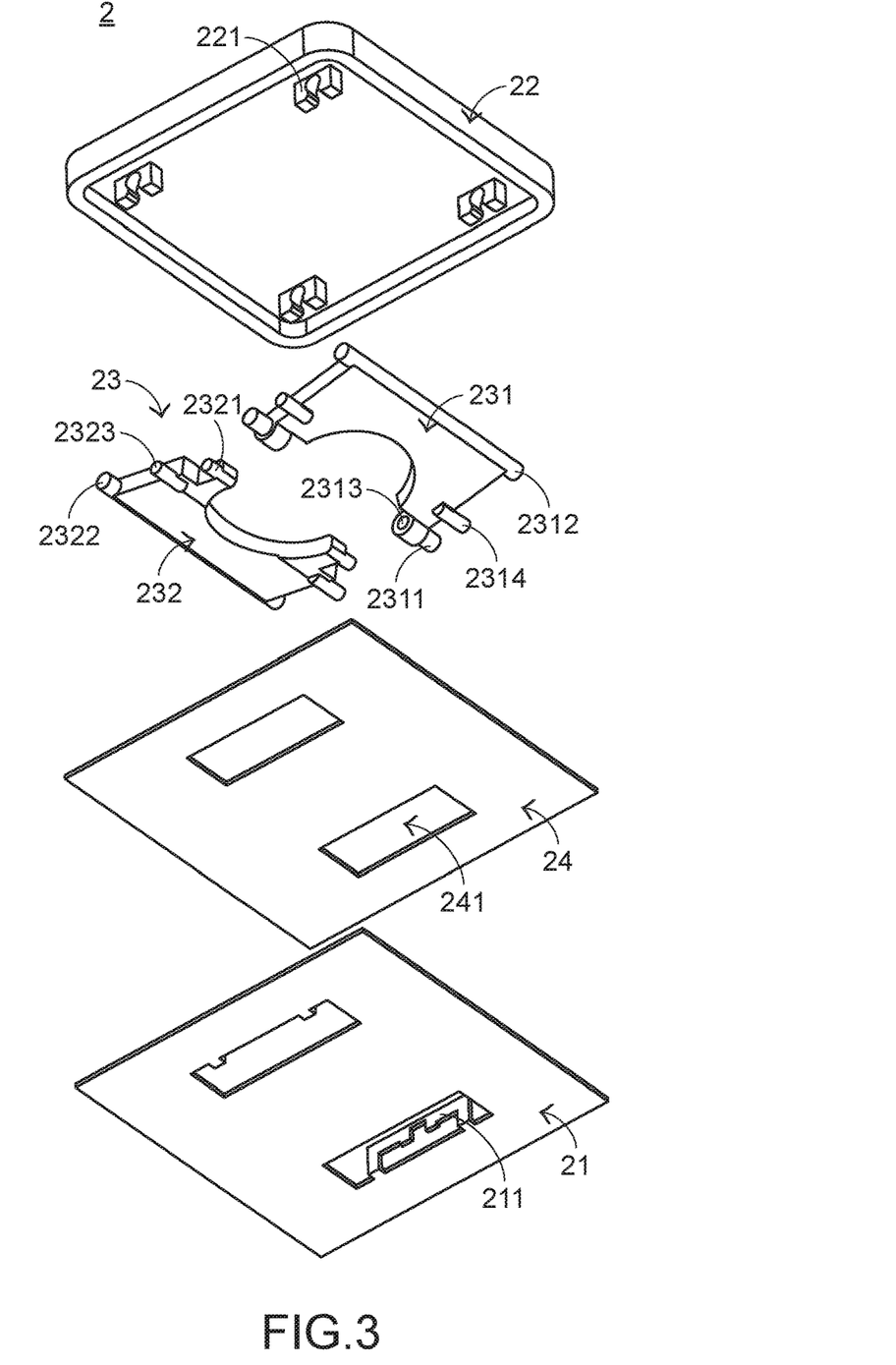
FIG. 3 is a schematic exploded view illustrating a portion of the keyboard device according to the embodiment of the present invention and taken along another viewpoint.

Hereinafter, the structure of the keyboard device of the present invention will be illustrated with reference to FIGS. 2 and 3. FIG. 2 is a schematic exploded view illustrating a portion of a keyboard device according to an embodiment of the present invention. FIG. 3 is a schematic exploded view illustrating a portion of the keyboard device according to the embodiment of the present invention and taken along another viewpoint. The keyboard device 2 comprises a base plate 21, plural keycaps 22, plural wing-type connecting elements 23, a switch circuit board 24 and plural elastic elements 25. For succinctness, only one keycap 22, one wing-type connecting element 23 and one elastic element 25 are shown in the drawings. The base plate 21 comprises plural connecting brackets 211. The connecting brackets 211 are protruded from the base plate 21. Moreover, a first receiving space 211A, a second receiving space 211B and a third receiving space 211C are formed between the connecting bracket 211 and a top surface of the base plate 21. The second receiving space 211B is arranged beside the first receiving space 211A. The third receiving space 211C is also arranged beside the first receiving space 211A. The plural keycaps 22 are exposed outside the keyboard device 2 so as to be depressed by the user. The keycap 22 comprises plural hooks 221. Through the hooks 221, the keycap 22 is combined with the corresponding wing-type connecting element 23. The wing-type connecting element 23 is located over the base plate 21 and connected with the corresponding connecting brackets 211. While the keycap 22 is depressed and swung relative to the base plate 21, the keycap 22 is moved in a vertical direction.

In an embodiment, the wing-type connecting element 23 comprises a first frame 231 and a second frame 232. The first frame 231 is located under the keycap 22 and arranged near a first side of the keycap 22. A first end of the first frame 231 is inserted into the connecting bracket 211, so that the first frame 231 is connected with the base plate 21. A second end of the first frame 231 is inserted into the hooks 221, so that the first frame 231 is connected with the keycap 22. The second frame 232 is located under the keycap 22 and arranged near a second side of the keycap 22. A first end of the second frame 232 is inserted into the first frame 231, so that the second frame 232 is connected with the first frame 231. A second end of the second frame 232 is inserted into the hooks 221, so that the second frame 232 is connected with the keycap 22. Moreover, the second frame 232 is connected with the base plate 21 through the first end of the first frame 231. The first frame 231 comprises a first connecting shaft 2311, a second connecting shaft 2312, an indentation 2313 and a first sliding shaft 2314. The second frame 232 comprises a third connecting shaft 2321, a fourth connecting shaft 2322 and a second sliding shaft 2323.

The structure of the first frame 231 will be described as follows. The first connecting shaft 2311 is located at the first end of the first frame 231 and disposed on an outer side of the first frame 231. The first connecting shaft 2311 is inserted into the first receiving spaces 211A of the connecting brackets 211. The second connecting shaft 2312 is located at the second end of the first frame 231. Moreover, the second connecting shaft 2312 is connected with the corresponding hooks 221 of the keycap 22. The indentation 2313 is located at the first end of the first frame 231 and formed in an inner side of the first frame 231. The first end of the second frame 232 is inserted into the indentation 2313. Consequently, the first frame 231 and the second frame 232 are combined together. The first sliding shaft 2314 is arranged between the first connecting shaft 2311 and the second connecting shaft 2312. In addition, the first sliding shaft 2314 is arranged near the first connecting shaft 2311. The first sliding shaft 2314 is inserted into the second receiving spaces 211B of the connecting brackets 211. Since the first connecting shaft 2311 and the first sliding shaft 2314 are inserted into the corresponding receiving spaces of the connecting brackets 211, the first frame 231 and the base plate 21 are combined together.

The structure of the second frame 232 will be described as follows. The third connecting shaft 2321 is located at the first end of the second frame 232. After the third connecting shaft 2321 is inserted into the indentation 2313 of the first frame 231, the first frame 231 and the second frame 232 are combined together. The fourth connecting shaft 2322 is located at the second end of the second frame 232. The fourth connecting shaft 2322 is connected with the corresponding hooks 221 of the keycap 22. The second sliding shaft 2323 is arranged between the third connecting shaft 2321 and the fourth connecting shaft 2322. In addition, the second sliding shaft 2323 is arranged near the third connecting shaft 2321. The second sliding shaft 2323 is inserted into the third receiving space 211C of the connecting brackets 211. Since the third connecting shaft 2321 and the second sliding shaft 2323 are inserted into the corresponding receiving spaces of the connecting brackets 211, the second frame 232 and the base plate 21 are combined together.

As shown in the drawings, the height of the first receiving space 211A is larger than the height of the third receiving space 211C, and the height of the second receiving space 211B and the height of the third receiving space 211C are identical.

Figure 4:
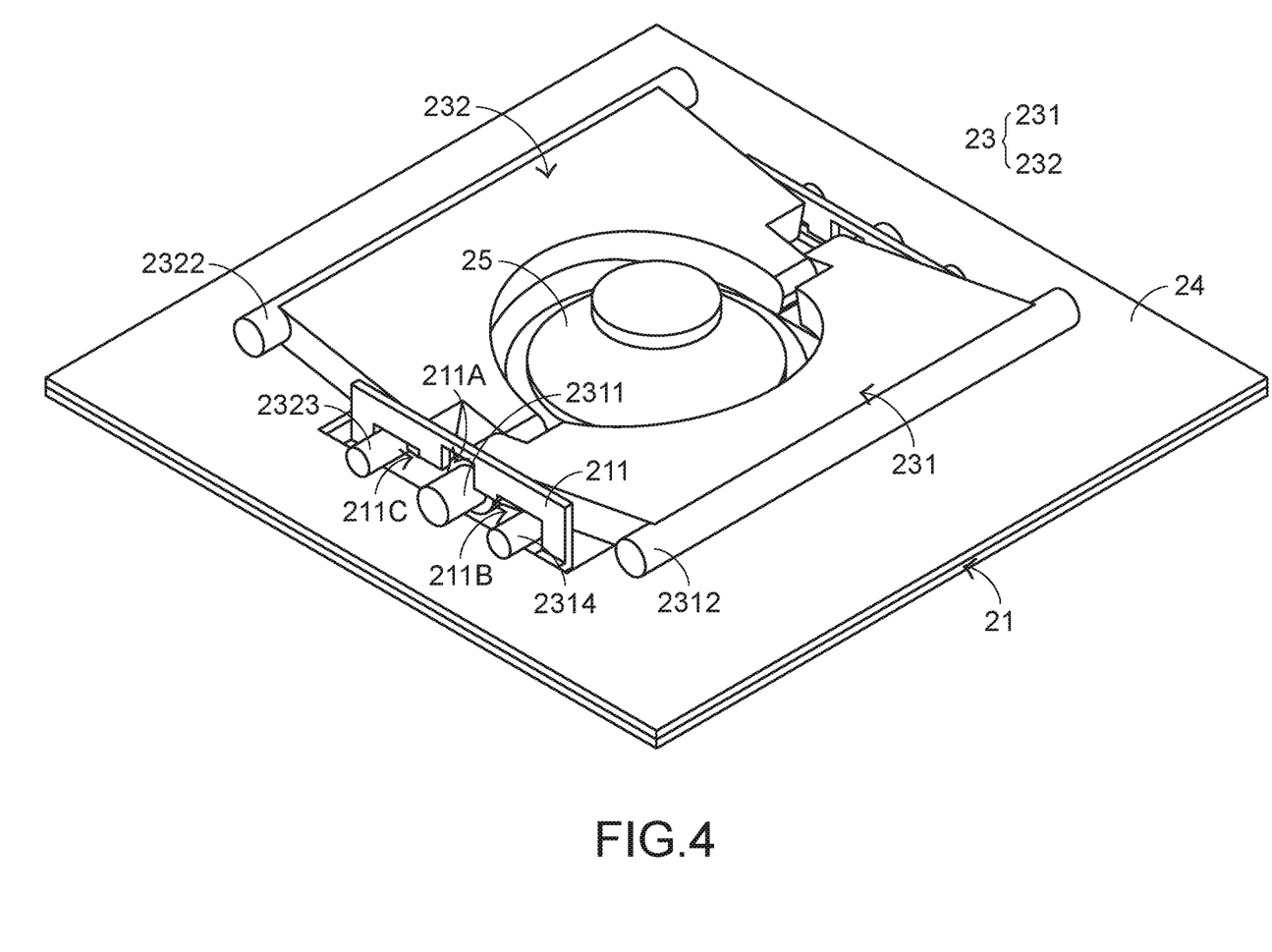
FIG. 4 is a schematic perspective view illustrating a portion of the keyboard device according to the embodiment of the present invention.

Please refer to FIGS. 2, 3 and 4. The switch circuit board 24 is arranged between the plural keycaps 22 and the base plate 21. When one of the plural keycaps 22 is depressed by the user, the keycap 22 is moved downwardly to trigger the switch circuit board 22. Consequently, the switch circuit board 24 generates a key signal corresponding to the depressed keycap 22. The switch circuit board 24 comprises plural openings 241. Each opening 241 is aligned with one connecting bracket 211. When the switch circuit board 24 and the base plate 21 are stacked on each other, the connecting brackets 211 are penetrated through the corresponding openings 241 so as to be connected with the first frame 231 and the second frame 232. The elastic element 25 is arranged between the corresponding keycap 22 and the switch circuit board 24, and penetrated through the corresponding wing-type connecting element 23. As the keycap 22 is moved downwardly to push the elastic element 25, the switch circuit board 24 is triggered by the elastic element 25. In an embodiment, the elastic elements 25 are rubbery elastomers, and the switch circuit board 24 is a membrane switch circuit board. The inner structure of the switch circuit board 24 comprises an upper wiring plate, a lower wiring plate and a separation layer. The upper wiring plate, the lower wiring plate and the separation layer are well known to those skilled in the art, and are not redundantly described herein. In another embodiment, the elastic element is a metal dome. Since the thickness of the metal dome is small, the overall thickness of the keyboard device is reduced.

Figure 5:
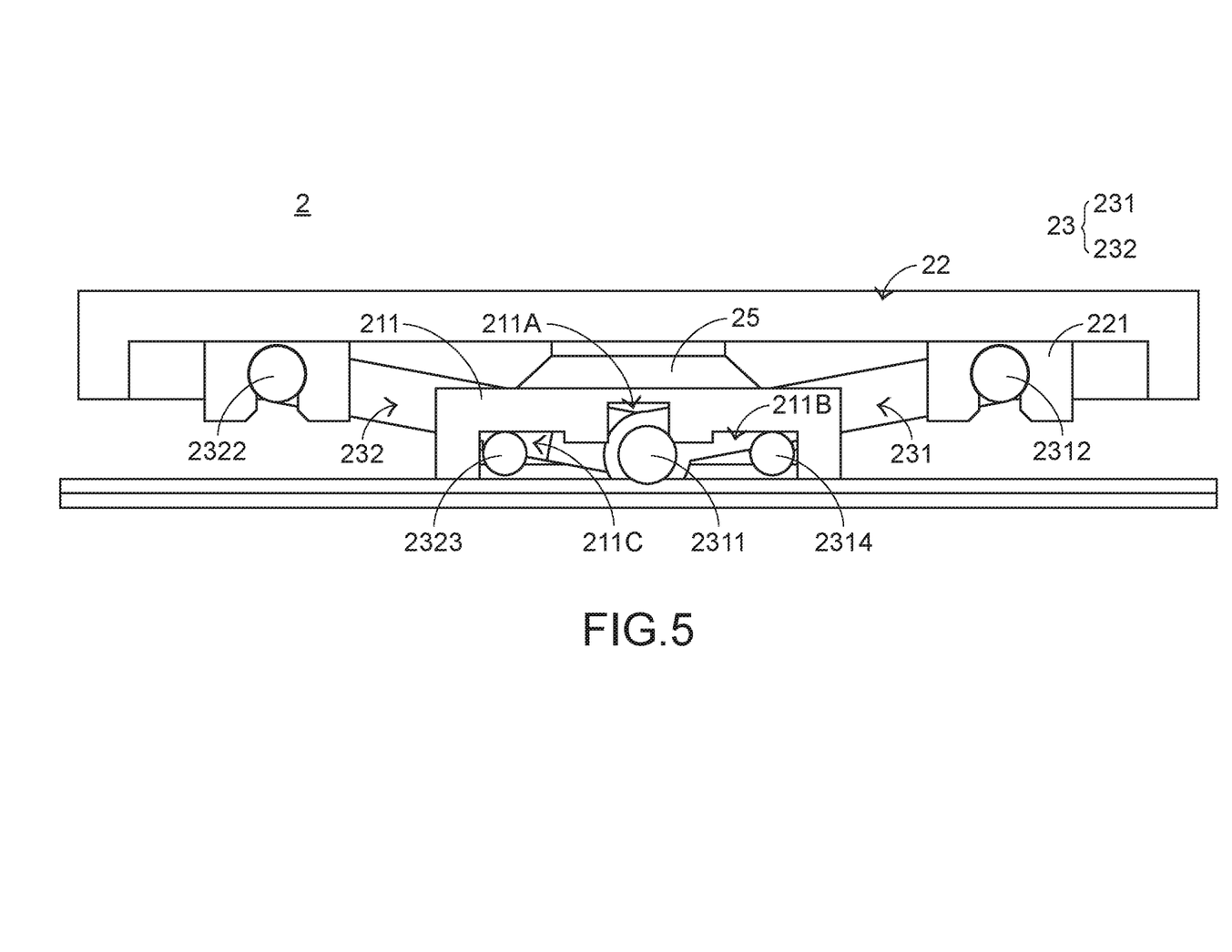
FIG. 5 is a schematic cross-sectional side view illustrating a portion of the keyboard device according to the embodiment of the present invention, in which the keycap is not depressed.
Figure 6:
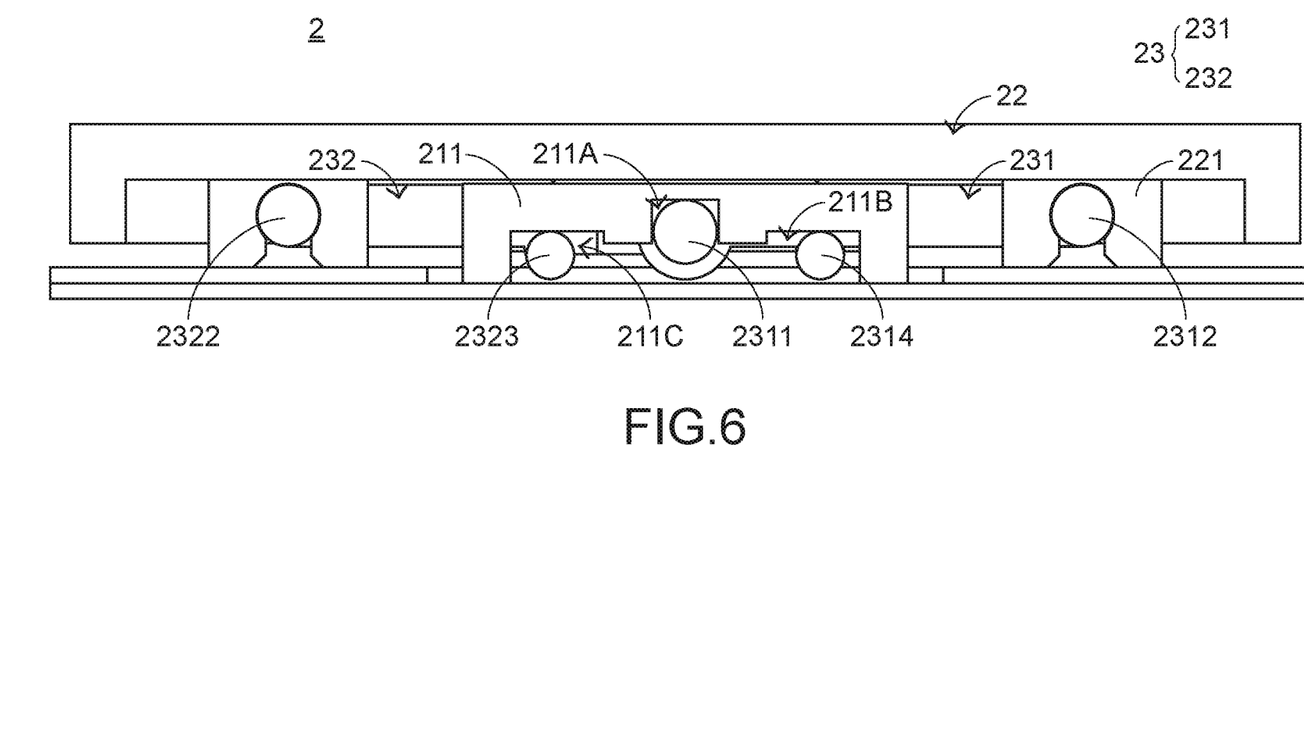
FIG. 6 is a schematic cross-sectional side view illustrating a portion of the keyboard device according to the embodiment of the present invention, in which the keycap is depressed.

Please refer to FIGS. 4, 5 and 6. FIG. 4 is a schematic perspective view illustrating a portion of the keyboard device according to the embodiment of the present invention. FIG. 5 is a schematic cross-sectional side view illustrating a portion of the keyboard device according to the embodiment of the present invention, in which the keycap is not depressed. FIG. 6 is a schematic cross-sectional side view illustrating a portion of the keyboard device according to the embodiment of the present invention, in which the keycap is depressed. The connecting relationships between associated components are shown in FIGS. 4 and 5. The first connecting shaft 2311 and the first sliding shaft 2314 of the first frame 231 are inserted into the corresponding connecting brackets 211. The third connecting shaft 2321 of the second frame 232 is inserted into the indentation 2313 of the first frame 231. The second sliding shaft 2323 is inserted into the connecting brackets 211. The fourth connecting shaft 2322 is inserted into the corresponding hooks 221 of the keycap 22.

While the keycap 22 is depressed, the keycap 22 is moved downwardly relative to the base plate 21 in the vertical direction to push the second connecting shaft 2312 and the fourth connecting shaft 2322. Consequently, the first frame 231 is swung relative to the base plate 21 by using the first connecting shaft 2311 as the fulcrum. In addition, the first connecting shaft 2311 is moved within the first receiving space 211A in the vertical direction, and the first sliding shaft 2314 is horizontally moved and rotated within the second receiving space 211B. Since the third connecting shaft 2321 is connected with the first frame 231, the second frame 232 is swung relative to the base plate 21 by using the third connecting shaft 2321 as the fulcrum. As the first connecting shaft 2311 is moved in the vertical direction, the third connecting shaft 2321 is moved in the vertical direction. Moreover, the second sliding shaft 2323 is horizontally moved and rotated within the third receiving space 211C.

As the keycap 22 is moved downwardly to push the elastic element 25, the elastic element 25 is compressed in response to the depressing force. Since the switch circuit board 24 is pushed by the compressed elastic element 25, the switch circuit board 24 is triggered to generate a key signal corresponding to the depressed keycap 22. When the elastic element 25 is no longer pushed by the keycap 22, the elastic element 25 is restored to its original shape to provide an elastic force to the keycap 22. In response to the elastic force, the keycap 22 is moved upwardly in the vertical direction. Consequently, the keycap 22 is returned to its original position. As the keycap 22 is moved upwardly in the vertical direction, the first frame 231 and the second frame 232 are swung to the state of FIG. 5.

The first receiving space 211A, the second receiving space 211B and the third receiving space 211C of the connecting bracket 211 are collaboratively formed as a T-shaped space. Consequently, the first connecting shaft 2311 is movable within the first receiving space 211A in the vertical direction, the first sliding shaft 2314 is horizontally movable and rotatable within the second receiving space 211B, and the second sliding shaft 2323 is horizontally movable and rotatable within the third receiving space 211C. The travelling distance of the keycap 22 is determined according to the height of the first receiving space 211A. The height of the first receiving space 211A may be varied according to the practical requirements. As the height of the first receiving space 211A is increased, the travelling distance of the keycap 22 is increased. As the height of the first receiving space 211A is decreased, the travelling distance of the keycap 22 is decreased.

From the above descriptions, the present invention provides the keyboard device. The wing-type connecting element is connected with the base plate and the keycap. The connecting bracket has a special shape. The base plate and the wing-type connecting element are combined together through the connecting bracket. Due to the structures of the wing-type connecting element and the connecting bracket, the swinging extent of the wing-type connecting element is smaller than the swinging extent of the conventional scissors-type connecting element. Since the swinging extent of the wing-type connecting element is reduced when compared with the conventional scissors-type connecting element, the wing-type connecting element is swung more stably. Consequently, the depressing stability of the keycap is enhanced. In addition, the thickness of the keyboard device is reduced. While the keycap is depressed, the first connecting shaft of the wing-type connecting element is inserted into the connecting bracket to be used as the swinging fulcrum. Consequently, the vertical movement of the connecting bracket is restricted by the height of the first receiving space. Consequently, the movable range of the first connecting shaft in the vertical direction is controllable. That is, the travelling distance of the keycap of the keyboard device can be controlled.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A keyboard device, comprising:
    a base plate comprising at least one connecting bracket;
    a wing-type connecting element disposed on the base plate, and connected with the at least one connecting bracket, wherein the wing-type connecting element is permitted to be swung relative to the base plate, and the wing-type connecting element comprises:
        a first frame located under the keycap and arranged near a first side of the keycap, wherein the first frame comprises a first sliding shaft, and the first sliding shaft and a first end of the first frame are inserted into the at least one connecting bracket, so that the first frame and the base plate are combined together; and
        a second frame located under the keycap and arranged near a second side of the keycap, wherein the second frame comprises a second sliding shaft, and a first end of the second frame is inserted into the first frame, so that the second frame and the first frame are combined together, wherein the second frame is connected with the base plate through the first end of the first frame and the second sliding shaft; and
    a keycap connected with a second end of the first frame and a second end of the second frame, and movable relative to the base plate, wherein while the keycap is depressed, the first end of the first frame is moved upward within a first receiving space of the at least one connecting bracket in a vertical direction.

2. The keyboard device according to claim 1, wherein the first frame further comprises:
    a first connecting shaft located at the first end of the first frame and disposed on an outer side of the first frame, wherein the first connecting shaft is inserted into the first receiving space of the at least one connecting bracket;
    a second connecting shaft located at the second end of the first frame, and connected with the keycap; and
    an indentation located at the first end of the first frame and formed in an inner side of the first frame, wherein a first end of the second frame is inserted into the indentation, so that the first frame and the second frame are combined together.

3. The keyboard device according to claim 2, wherein the at least one connecting bracket further comprises a second receiving space, and the second receiving space is arranged beside the first receiving space, wherein the first sliding shaft is arranged between the first connecting shaft and the second connecting shaft, arranged near the first connecting shaft, and inserted into the second receiving space.

4. The keyboard device according to claim 3, wherein while the key cap is depressed, the keycap is moved relative to the base plate in the vertical direction to push the second connecting shaft, so that the first frame is swung relative to the base plate, the first connecting shaft is moved within the first receiving space in the vertical direction and the first sliding shaft is horizontally moved within the second receiving space, wherein a traveling distance of the keycap is determined according to a height of the first receiving space.

5. The keyboard device according to claim 2, wherein the second frame further comprises:
    a third connecting shaft located at the first end of the second frame, wherein the third connecting shaft is inserted into the indentation of the first frame, so that the first frame and the second frame are combined together; and
    a fourth connecting shaft located at the second end of the second frame, wherein the fourth connecting shaft is connected with the keycap.

6. The keyboard device according to claim 5, wherein the at least one connecting bracket further comprises a third receiving space, and the third receiving space is arranged beside the first receiving space, wherein the second sliding shaft is arranged between the third connecting shaft and the fourth connecting shaft, arranged near the third connecting shaft, and inserted into the third receiving space.

7. The keyboard device according to claim 6, wherein a height of the first receiving space is larger than a height of the third receiving space.

8. The keyboard device according to claim 6, wherein while the key cap is depressed, the keycap is moved relative to the base plate in the vertical direction to push the fourth connecting shaft, so that the second frame is swung relative to the base plate, the third connecting shaft is moved with the first connecting shaft in the vertical direction and the second sliding shaft is horizontally moved within the third receiving space.

9. The keyboard device according to claim 1, further comprising:
    a switch circuit board located over the base plate, wherein while the keycap is moved downwardly, the switch circuit board is triggered to generate a key signal; and
    an elastic element arranged between the keycap and the switch circuit board, and penetrated through the wing-type connecting element, wherein when the keycap is moved to push the elastic element, the switch circuit board is triggered by the elastic element, wherein when the elastic element is not pushed by the keycap, the keycap is returned to an original position in response to an elastic force of the elastic element.

10. The keyboard device according to claim 5, wherein the keycap comprises plural hooks, wherein the hooks are connected with the second connecting shaft of the first frame and the fourth connecting shaft of the second frame, so that the keycap and the wing-type connecting element are combined together.

* * * * *